United States Patent
Schweizer

(10) Patent No.: US 10,492,320 B2
(45) Date of Patent: Nov. 26, 2019

(54) DEVICE FOR SECURING A COMMUNICATIONS AND/OR AUTOMATION DEVICE TO A TOP HAT RAIL AND COMMUNICATIONS AND/OR AUTOMATION DEVICE

(71) Applicant: Siemens Aktiengesellschaft, Munich (DE)

(72) Inventor: Urs Schweizer, Malsch-Waldprechtsweier (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/073,647

(22) PCT Filed: Jan. 18, 2017

(86) PCT No.: PCT/EP2017/050917
§ 371 (c)(1),
(2) Date: Jul. 27, 2018

(87) PCT Pub. No.: WO2017/129452
PCT Pub. Date: Aug. 3, 2017

(65) Prior Publication Data
US 2019/0045649 A1    Feb. 7, 2019

(30) Foreign Application Priority Data
Jan. 29, 2016   (EP) ..................................... 16153412

(51) Int. Cl.
*H05K 7/02*   (2006.01)
*H02B 1/052*   (2006.01)
*F16M 13/02*   (2006.01)

(52) U.S. Cl.
CPC ............. *H05K 7/02* (2013.01); *F16M 13/022* (2013.01); *H02B 1/0523* (2013.01); *H02B 1/0526* (2013.01)

(58) Field of Classification Search
CPC ...... H05K 7/02; F16M 13/022; H02B 1/0523; H02B 1/0526; H02B 1/052; H01R 9/26
See application file for complete search history.

(56) References Cited

U.S. PATENT DOCUMENTS 5,392,196 A * 2/1995 Kinner .................. H02B 1/052
174/17 R
5,904,592 A * 5/1999 Baran .................... H02B 1/052
361/627

(Continued)

FOREIGN PATENT DOCUMENTS

DE    3922551    1/1991
DE    19709815   9/1998

(Continued)

OTHER PUBLICATIONS

PCT International Search Report and Written Opinion of International Searching Authority dated Oct. 3, 2017 corresponding to PCT International Application No. PCT/EP2017/05091 filed Jan. 18, 2017.

*Primary Examiner* — James Wu
*Assistant Examiner* — Hung Q Dang
(74) *Attorney, Agent, or Firm* — Cozen O'Connor

(57) ABSTRACT

A device for securing a communications or automation device to a top hat rail, wherein the device includes a base body, which can be connected to the communications or automation device on a front side, where at least one fixed first securing element that includes a groove or an undercut that can be engaged with an offset end of a first limb of a top hat rail is provided on a rear side of the base body, at least one second securing element provided on the rear side of the (Continued)

base element, which can be moved in the direction of the first securing element, is pretensioned in relation to the first securing element via a spring mechanism and includes a groove or an undercut that can be engaged with an offset end of a second limb of the top hat rail.

14 Claims, 3 Drawing Sheets

(56) References Cited

U.S. PATENT DOCUMENTS

| | | | | |
|---|---|---|---|---|
| 6,017,251 | A * | 1/2000 | Rittmann | H01R 9/2608 |
| | | | | 439/716 |
| 6,540,187 | B2 * | 4/2003 | Carter | E06B 9/323 |
| | | | | 160/178.1 R |
| 7,674,129 | B1 | 3/2010 | Liu | |
| 9,353,777 | B2 * | 5/2016 | Eminovic | H02B 1/052 |
| 9,485,879 | B2 * | 11/2016 | Molnar | H05K 5/0026 |
| 2008/0108248 | A1 * | 5/2008 | Lim | H02B 1/052 |
| | | | | 439/532 |
| 2010/0255713 | A1 * | 10/2010 | Peng | H02B 1/052 |
| | | | | 439/532 |
| 2012/0138759 | A1 * | 6/2012 | Takaya | H02B 1/052 |
| | | | | 248/225.21 |
| 2012/0298490 | A1 * | 11/2012 | Buttner | H02B 1/052 |
| | | | | 200/303 |
| 2014/0357117 | A1 * | 12/2014 | Deshpande | H02B 1/052 |
| | | | | 439/532 |

FOREIGN PATENT DOCUMENTS

| | | |
|---|---|---|
| EP | 2677846 | 12/2013 |
| FR | 2727804 | 6/1996 |
| WO | WO 2008/068312 | 6/2008 |

* cited by examiner

DEVICE FOR SECURING A COMMUNICATIONS AND/OR AUTOMATION DEVICE TO A TOP HAT RAIL AND COMMUNICATIONS AND/OR AUTOMATION DEVICE

CROSS-REFERENCE TO RELATED APPLICATIONS

This is a U.S. national stage of application No. PCT/EP2017/050917 filed Jan. 18, 2017. Priority is claimed on EP Application No. 16153412 filed Jan. 29, 2016, the content of which is incorporated herein by reference in its entirety.

BACKGROUND OF THE INVENTION

1. Field of the Invention

The invention relates to a device for securing a communications and/or an automation device to a top hat rail.

2. Description of the Related Art

Industrial automation systems that include a plurality of communications and automation devices serve to monitor, control and regulate technical processes, in particular in the area of production, process and building automation. Communications and/or automation devices include, for example, stored programmable control, decentralized peripheral modules, contactors, communications modules, switches and routers. Furthermore, industrial automation systems enable operation of control devices, sensors, machines and industrial plants that are to be effected as autonomously as possible and independently of human intervention. Due to the continuously increasing importance of information technology for automation systems that include numerous interconnected control or regulating units, methods for the reliable provision of functions distributed via an automation system for the provision of monitoring, control and regulating functions are becoming more and more important.

Frequently, communications or automation devices and electric operating devices, such as relays, impulse switches, timer switches, circuit breakers and terminal blocks, are secured on top hat rails, in particular in distributor boxes, switching cabinets or terminal boxes. A top hat rail is usually based on a profile rail produced from metal, upon which devices to be secured can be pushed from the side or plugged in from the front and locked. Numerous top hat rail types are standardized, for example, corresponding to DIN EN 60715.

DE 197 09 815 A1 discloses a device that is securable to a carrier rail which, on its device base, comprises a retaining slide that is loaded by a return spring and is movable between a retaining position and a release position. Multiple such devices can be strung together on a carrier rail. Furthermore, at least one retaining slide engages with a release lever that is operable from a device top surface. The release lever comprises a working arm with a force component in a working plane of the retaining slide in the release direction.

EP 2 677 846 A1 describes a device that is securable on a top hat rail and comprises a housing, a housing groove for receiving a top hat rail, a housing recess for receiving a slide and a spring-loaded slide as a securing element. The slide is movable into a locking position, at which an engagement portion of the slide projects out of the housing recess into the housing groove, and into a storage position in which an actuating portion of the slide is pushed into the housing recess on a side opposite the engagement portion. In the locking position, the actuating portion of the slide projects out of the housing recess beyond the housing. In the storage position, the engagement portion of the slide projects even further into the housing groove compared to the locking position and, in the locking position, can be moved into engagement with a corresponding end portion of a top hat rail. The actuating portion of the slide can only be inserted into the housing recess when the device is not plugged into the top hat rail.

U.S. Pat. No. 7,674,129 B1 relates to a securing device for a top hat rail that includes a leaf spring arranged on a basic element and a spring-loaded slide that includes a first and a second positioning element and is displaceable in relation to the basic element. In this case, the leaf spring as latching element is movable from the second positioning element to the first positioning element and is lockable there such that the securing device is not easily releasable from the top hat rail.

WO 2008/068312 A1 discloses a device for securing an electronic module on a carrier rail. The device comprises a movable lug which, together with a fixed lug provided on a rear side of a housing of the electronic module, encompasses a profile of the carrier rail in the mounted state. The movable lug is realized as a clamping profile of a slide such that the device is mountable on the rear side of the electronic module via plugging mechanical anchorages in recesses of the housing provided for this purpose. In addition, the device comprises a spring mechanism that is provided for support on the housing of the electronic module and via which the slide is acted upon with a force. A force clamping the device on the carrier rail results from this force. Furthermore, an end of the slide located opposite the movable lug projects beyond the housing of the electronic module for the manual displacement of the movable lug.

Under rough surrounding conditions, such as under the effects of impacts or vibrations, communications network components, in particular, are not secured well to TS-35 top hat rails using the above securing devices. For this reason, devices to be secured are screwed tightly to a top hat rail depending on the surrounding conditions. This means additional assembly expenditure.

SUMMARY OF THE INVENTION

Consequently, it is an object of the present invention to provide a device for simple and reliable securement of a communications and/or automation device to a top hat rail and a suitable communications and/or automation device.

This and other objects and advantages are achieved in accordance with the invention by a device and by a communications and/or automation device, where the device in accordance with the invention secures a communications and/or automation device to a top hat rail and includes a basic body that is connectable to the communications and/or automation device and comprises a first side facing the communications and/or automation device and a second side remote from the communications and/or automation device. The basic body can be integrated, for example, in a housing of the communications and/or automation device. In addition, the device includes, on the second side of the basic body, at least one stationary first fixing element that comprises a groove or an undercut that is movable into engagement with a bent end of a first leg of a top hat rail. In addition, at least one second fixing element, which is displaceable in the direction of the first fixing element, is provided on the second side of the basic body. The second fixing element is prestressed in relation to the first fixing element via a spring mechanism and, on a first end, comprises a groove or an undercut that is movable into engagement with a bent end of a second leg of the top hat rail. Here, the first and the second fixing elements, with the second fixing element in a locking position, encompass the bent ends of the legs of the top hat rail in a substantially positive locking manner. The second fixing element is displaceable between the locking position and an assembly position. The first leg of a top hat rail, with the top hat rail in the mounted state, can be, for example, an upper leg whilst the second leg, with the top hat rail in the mounted state, can be a lower leg. In addition, the at least one first fixing element can be configured in a hook-like manner, here.

In accordance with the invention, a boundary element, which extends transversely with respect to a displacement direction of the second fixing element and comprises two support surfaces that are inclined oppositely to one another, is arranged on a second end of the second fixing element. The boundary element can be formed, for example, as an elongated lip with a trapezoidal or triangular cross section. In addition, a threaded bore is provided through an end portion of the basic element adjoining the second end of the second fixing element. Furthermore, a securing screw is screwed into the threaded bore from the first side of the basic element. Here, a free end of the securing screw, with the second fixing element in the assembly position, is tensionable against a first support surface of the boundary element and, with the second fixing element in the locking position, is tensionable against a second support surface of the boundary element.

With such spring-loaded sliding latching, which can be tensioned simply and securely by the securing screw from the first side of the basic body, a communications and/or automation device is tensioned fixedly with a top hat rail independently of a respective top hat rail type. The device in accordance with the invention is consequently extraordinarily good for use under rough surrounding conditions.

In a particularly preferred embodiment of the present invention, the securing screw comprises a knurling on its screw head. Consequently, tool-free use of such a device is easily possible. Furthermore, on the second side, the basic element can comprise at least two guide elements that encompass the second fixing element. Consequently, the second fixing element is securely guided in a displacement between the locking position and assembly position. In addition, on the second side, the basic element can comprise a journal or a securing device that engages in an elongated hole provided on the second side. Here, the journal or the securing device forms a stop for a displacement of the second fixing element between the assembly position and the locking position. This ensures that the guiding of the second fixing element, when the second fixing element is displaced between the locking position and the assembly position, is improved even further.

In a further embodiment of the present invention, at the second end of the second fixing element at least one third fixing element is provided with a groove or an undercut that is movable into engagement with an end of the second leg of a further top hat rail type. Here, in a locking position, the first and the third fixing elements encompass the ends of the legs of a top hat rail of the further top hat rail type in a substantially positive locking manner. In addition, a plurality of first fixing elements, which are spaced apart from one another, can be provided on the second side of the basic body. Here, the grooves or undercuts of the first fixing elements are movable into engagement with an end of a first leg of a top hat rail of a respectively assigned top hat rail type. For example, first fixing elements can be arranged in pairs on the second side of the basic body each adjoining oppositely situated end faces of the basic body. All in all, a universal device for securing a communications and/or automation device to a plurality of different top hat rail types is consequently created.

The communications and/or automation device in accordance with the invention includes a housing in which a device corresponding to the preceding embodiments is integrated.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The present invention is explained in more detail below by an exemplary embodiment by way of the drawing, in which.

DETAILED DESCRIPTION OF THE EXEMPLARY EMBODIMENTS

Figure 1:
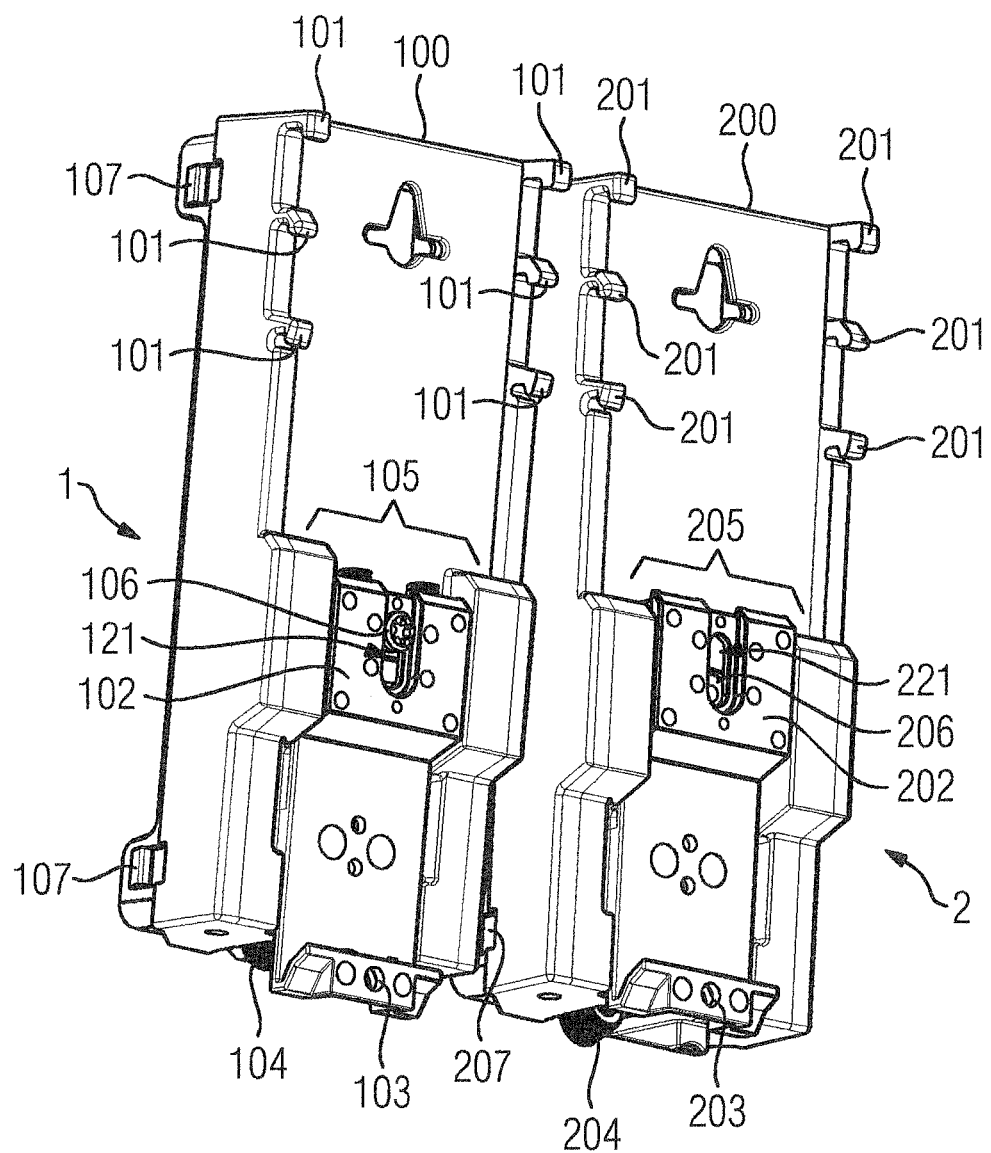
FIG. 1 shows a rear perspective representation of two devices for securing a communications and/or automation device to a top hat rail in accordance with the invention.

The devices 1, 2 shown in FIG. 1 for securing a communications and/or automation device to a top hat rail each include a basic body 100, 200, which is connectable to the communications and/or automation device and comprises a front side that faces the communications and/or automation device and a rear side that is remote from the communications and/or automation device. The respective basic body 100, 200 can also be integrated, for example, in a housing of the communications and/or automation device. In the present exemplary embodiment the basic bodies 100, 200 include multiple latching elements 107, 207 (see also FIGS. 2 and 3) on their front sides for latching the housing of a communications and/or automation device to the respective basic body 100, 200.

Figure 3:
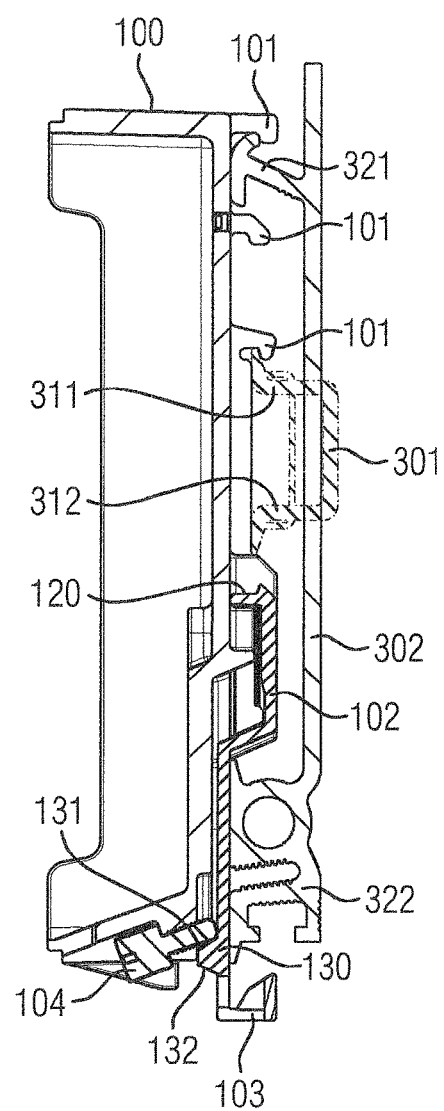
FIG. 3 shows a sectional representation of the device of FIG. 2 in conjunction with a top hat rail arrangement.
Figure 5:
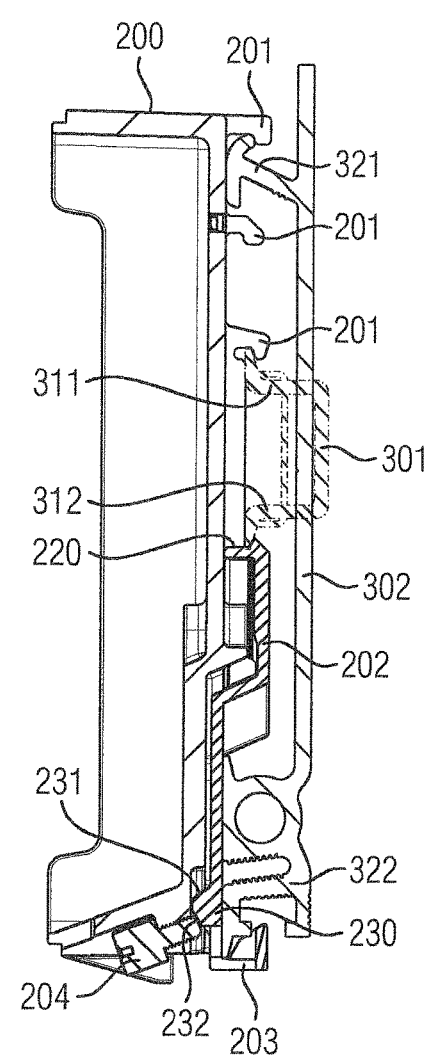
FIG. 5 shows a sectional representation of the device of FIG. 4 in conjunction with a top hat rail arrangement.

A plurality of first upper fixing elements 101, 201, which are spaced apart from one another, are provided on the rear side of the respective basic body 100, 200, the hook-like grooves or undercuts of which are movable into engagement with an end of a first upper leg 311, 321 of a top hat rail 301, 302 of a respectively assigned top hat rail type (see FIGS. 3 and 5). A top hat rail arrangement, which includes a TS-35 top hat rail 301 and a SIMATIC-S7 profile rail 302, is shown in the present exemplary embodiment. The TS-35 top hat rail 301 comprises bends at its leg ends, whilst the SIMATIC-S7 profile rail 302 comprises a groove on its second lower leg 322. The first fixing elements 101, 201 are arranged in pairs each adjoining the opposite end faces of the respective basic body 100, 200.

Figure 2:
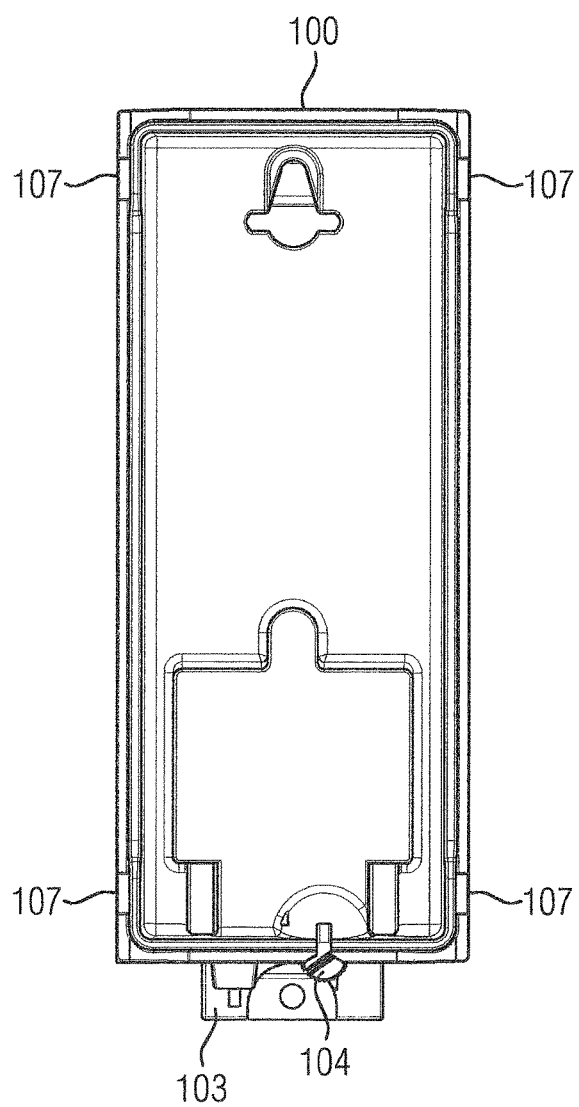
FIG. 2 shows a front-side representation of a first device of FIG. 1.
Figure 4:
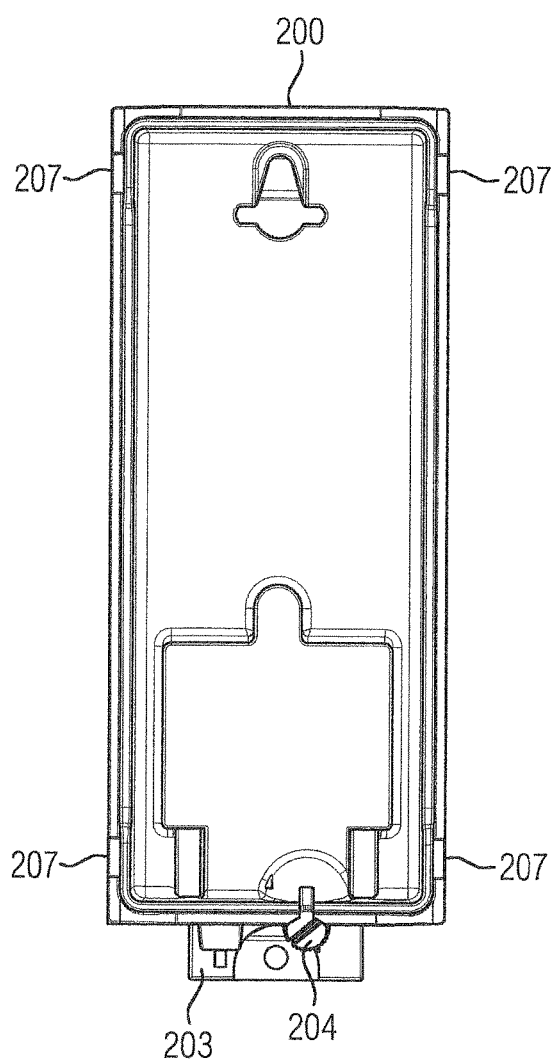
FIG. 4 shows a front-side representation of a second device of FIG. 1.

A second lower fixing element 102, 202, which is formed as a slide and is displaceable in the direction of the first upper fixing elements 101, 201, is also provided on the rear side of the respective basic body 100, 200. The respective second lower fixing element 102, 202 is prestressed via a spring mechanism in relation to the first upper fixing element 101, 201 and comprises a groove or an undercut 120, 220 on a first end. The groove or undercut 120, 220 is movable into engagement with a bent end of a second lower leg 312 of the TS-35 top hat rail 301. Here, the first upper 101, 201 and the second lower fixing elements 102, 202, with the respective second lower fixing element 102, 202 in a locking position, encompass the bent ends of the legs 311, 312 of the TS-35 top hat rail in a substantially positive locking manner. Here, the respective second lower fixing element 102, 202 is displaceable between the locking position and an assembly position. With reference to FIG. 1, a first device 1 with a second lower fixing element 102 is shown in the assembly position, whilst a second device 2 with a second lower fixing element is shown in the locking position. A front view and sectional representation of the first device 1 is shown in FIGS. 2 and 3, while a front view and sectional representation of the second device 2 is shown in FIGS. 4 and 5.

The basic elements 100, 200 each comprise, on their rear side, two integrated guide elements 105, 205 that encompass the respective second lower fixing element 102, 202. In addition, the basic elements 100, 200 each comprise, on their rear side, a guide screw 106, 206, the shank of which engages in an elongated hole 121, 221 provided on the respective second lower fixing element 102, 202. Here, the respective guide screw 106, 206 forms a stop for a displacement of the respective second lower fixing element 102, 202 between the assembly position and the locking position. Such a stop can also be formed on the respective basic body 100, 200, for example, by a journal or a different fastener instead of by a guide screw 106, 206.

With reference to FIGS. 3 and 5, a boundary element 130, 230, which is formed as an elongated lip with a trapezoidal or triangular cross section, is arranged in each case on a second end of the respective second lower fixing element 102, 202. Furthermore, the boundary elements 130, 230 extend transversely to a displacement direction of the respective second lower fixing element 102, 202 and comprise in each case two support surfaces 131-132, 231-232 that are inclined oppositely to one another. In addition, the basic bodies 100, 200 each comprise a threaded bore through an end portion that adjoins the second end of the respective second lower fixing element 102, 202. A fastening screw 104, 204 is screwed into the assigned threaded bore from the front side of the respective basic element 100, 200. Here, a free end of a securing screw 104, 204, with the respective second lower fixing element 102, 202 in the assembly position, is tensionable against a first support surface 131, 231 of the assigned boundary element 130, 230 and, with the respective second lower fixing element 102, 202 in the locking position, against a second support surface 132, 232 of the assigned boundary element 130, 230. For tool-free actuating, the securing screws 104, 204 each comprise a knurling on their screw head.

Along with the second lower fixing elements 102, 202 for the TS-35 top hat rail 301, the basic bodies 100, 200 each include third lower fixing elements 103, 203 for the SIMATIC-S7 profile rail 302. The third lower fixing elements 103, 203 are each provided on the second end of the respective second lower fixing element 102, 202 and each comprise a groove or undercut that is movable into engagement with a groove on an end of the second lower leg 322 of the SIMATIC-S7 profile rail 302. Here, the first upper 101, 201 and the third lower fixing elements 103, 203 encompass the ends of the legs 321, 322 of the SIMATIC-S7 profile rail 302 in a substantially positive locking manner in the locking position.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A device for securing at least one of a communications and an automation device to a top hat rail, comprising:
    a basic body which is connectable to at least one of the communications and the automation device and comprises a first side facing at least one of the communications and the automation device and a second side remote from at least one of the communications and the automation device;
    at least one stationary first fixing element arranged on the second side of the basic body, said at least one stationary first fixing element comprising a groove or an undercut which is movable into engagement with a bent end of a first leg of a top hat rail;
    at least one second fixing element which is displaceable in the direction of the first fixing element and arranged on the second side of the basic body, said at least one second fixing element being prestressed in relation to the at least one stationary first fixing element and, on a first end, comprising a groove or an undercut which is movable into engagement with a bent end of a second leg of the top hat rail, the at least one first and second fixing elements, with the at least one second fixing element in a locking position, encompassing the bent ends of the first and second legs of the top hat rail in a substantially positive locking manner, and the at least one second fixing element being displaceable between the locking position and an assembly position;
    a boundary element arranged on a second end of the at least one second fixing element which extends transversely with respect to a displacement direction of the at least one second fixing element and which comprises two support surfaces which are inclined oppositely to one another;
    a threaded bore extending through an end portion of the basic body adjoining the second end of the at least one second fixing element; and
    a securing screw screwed into the threaded bore from the first side of the basic body, a free end of said securing screw, with the at least one second fixing element in the assembly position, being tensionable against a first support surface of the boundary element and, with the at least one second fixing element in the locking position, being tensionable against a second support surface of the boundary element.

2. The device as claimed in claim 1, wherein the securing screw comprises a knurling on its screw head.

3. The device as claimed in claim 1, wherein the boundary element is formed as an elongated lip having a trapezoidal or triangular cross section.

4. The device as claimed in claim 2, wherein the boundary element is formed as an elongated lip having a trapezoidal or triangular cross section.

5. The device as claimed in claim 1, wherein the basic body, on the second side, comprises at least two guide elements which encompass the at least one second fixing element.

6. The device as claimed in claim 2, wherein the basic body, on the second side, comprises at least two guide elements which encompass the at least one second fixing element.

7. The device as claimed in claim 3, wherein the basic body, on the second side, comprises at least two guide elements which encompass the at least one second fixing element.

8. The device as claimed in claim 1, wherein, on the second side, the basic body comprises a journal or a securing device which engages in an elongated hole provided on the second fixing element; and wherein the journal or the securing device forms a stop for a displacement of the at least one second fixing element between the assembly position and the locking position.

9. The device as claimed in claim 1, wherein at the second end of the at least one second fixing element at least one third fixing element is provided with a groove or an undercut which is movable into engagement with an end of a second leg of a further top hat rail type, wherein, in a locking position, the at least one first and third fixing elements encompass the ends of the legs of a top hat rail of the further top hat rail type in a substantially positive locking manner.

10. The device as claimed in claim 1, further comprising:
 a plurality of first fixing elements, which are spaced apart from one another, arranged on the second side of the basic body, the grooves or undercuts of said plurality of first fixing elements being movable into engagement with an end of a first leg of a top hat rail of a respectively assigned top hat rail type.

11. The device as claimed in claim 1, wherein first fixing elements are arranged in pairs on the second side of the basic body each adjoining oppositely situated end faces of the basic body.

12. The device as claimed in claim 1, wherein, with the top hat rail in a mounted state, the first leg of a top hat rail is an upper leg; wherein, with the top hat rail in the mounted state, the second leg of the top hat rail is a lower leg; and wherein the at least one first fixing element is formed in a hook-like manner.

13. The device as claimed in claim 1, wherein the basic body is integrated in a housing of at least one of the communications and automation device.

14. A communications and/or automation device having a housing in which the device as claimed in claim 1 is integrated.

* * * * *